United States Patent [19]

Paul

[11] Patent Number: 4,604,176

[45] Date of Patent: Aug. 5, 1986

[54] METHOD OF IMPROVING MAGNETORESISTIVE EFFECT IN THIN MAGNETIC FILM

[75] Inventor: Maynard C. Paul, Bloomington, Minn.

[73] Assignee: Sperry Corporation, New York, N.Y.

[21] Appl. No.: 595,228

[22] Filed: Mar. 30, 1984

[51] Int. Cl.$^4$ ............................................ H01F 10/02
[52] U.S. Cl. ........................ 204/192 M; 204/192 EC; 427/128; 427/130; 427/132
[58] Field of Search ....... 204/192 E, 192 EC, 192 M; 427/130, 132, 128; 428/900, 695

Primary Examiner—Bernard D. Pianalto
Attorney, Agent, or Firm—Charles A. Johnson; Kenneth T. Grace; Marshall M. Truex

[57] ABSTRACT

A method of fabricating a thin magnetic film having improved magnetoresistive readout characteristics as a binary memory device is disclosed. The film is initially formed from a metal vapor as a series of discrete grains upon a substrate surface that is heated to approximately 300° C. Upon continued growth of the film, the grains merge at their boundaries forming a continuous thin film, the grain boundary heights of which, e.g., 1000 Å, are substantially greater than the thickness, e.g., 320 Å, of the eventual thin magnetizable film. The thin film is then rotated while being ion milled at an oblique angle to a substantially uniform film thickness of e.g. 320 Å.

8 Claims, 8 Drawing Figures

ION-MILLING THICK FILM AT HIGH ANGLE OF INCIDENCE FROM SURFACE NORMAL WHILE ROTATING SUBSTRATE.

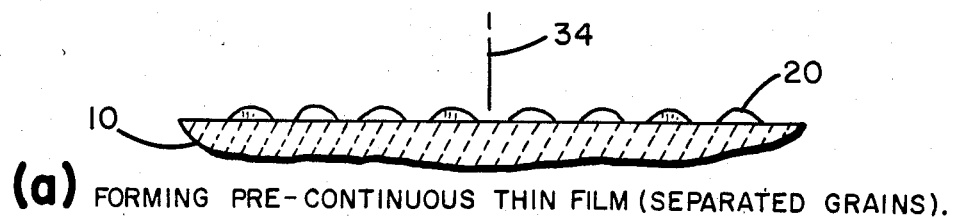

(a) FORMING PRE-CONTINUOUS THIN FILM (SEPARATED GRAINS).

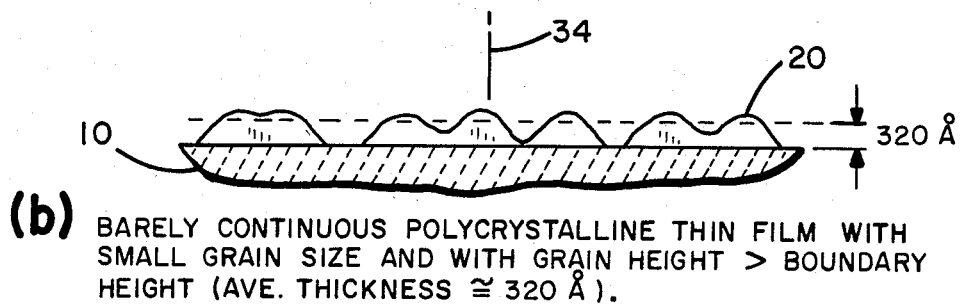

(b) BARELY CONTINUOUS POLYCRYSTALLINE THIN FILM WITH SMALL GRAIN SIZE AND WITH GRAIN HEIGHT > BOUNDARY HEIGHT (AVE. THICKNESS ≅ 320 Å).

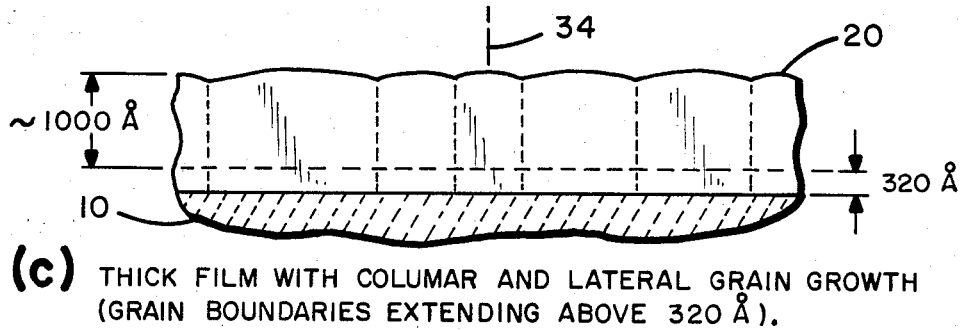

(c) THICK FILM WITH COLUMAR AND LATERAL GRAIN GROWTH (GRAIN BOUNDARIES EXTENDING ABOVE 320 Å).

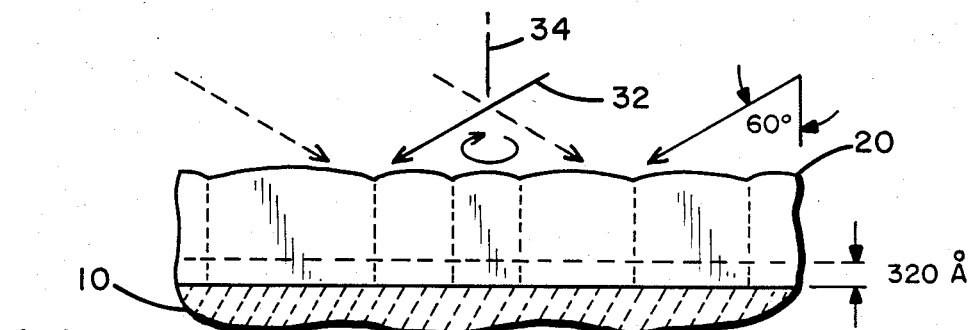

(d) ION-MILLING THICK FILM AT HIGH ANGLE OF INCIDENCE FROM SURFACE NORMAL WHILE ROTATING SUBSTRATE.

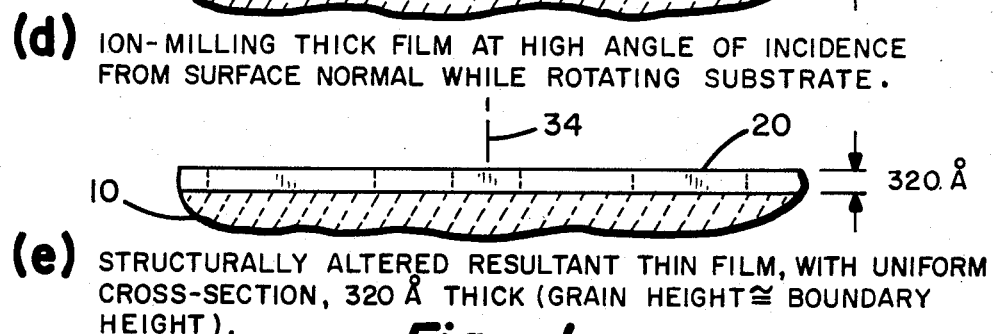

(e) STRUCTURALLY ALTERED RESULTANT THIN FILM, WITH UNIFORM CROSS-SECTION, 320 Å THICK (GRAIN HEIGHT ≅ BOUNDARY HEIGHT).

*Fig. 1*

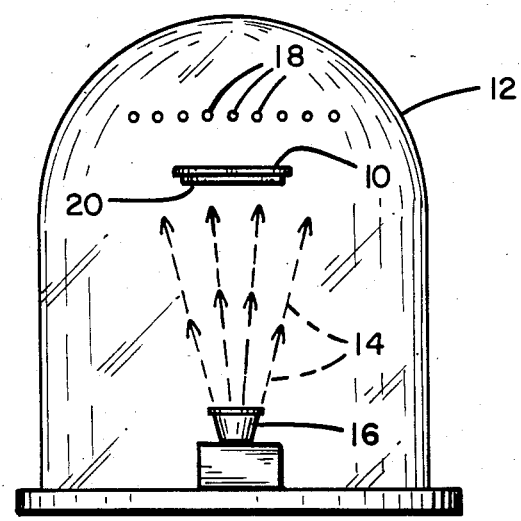
Fig. 2  DEPOSITION CHAMBER
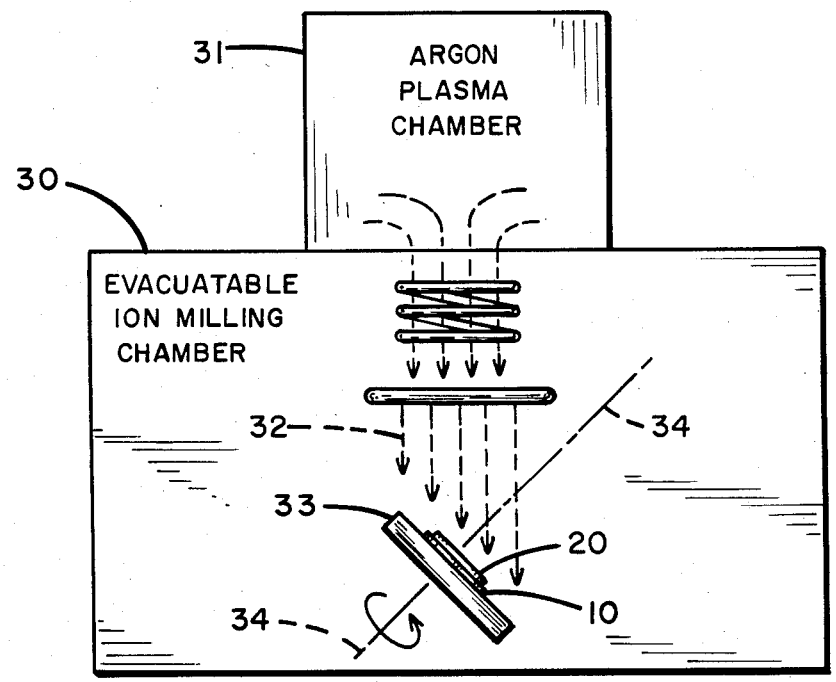
Fig. 3  ION MILLING (ETCHING) CHAMBER

Fig. 4

| FILM PARAMETERS | | | | MAGNETORESISTANCE | | |
|---|---|---|---|---|---|---|
| FILM COMPOSITION | THICKNESS (Å) | | DEP. TEMP. (°C) | AVE ΔR/R (%) | RANGE ΔR/R (%) FOR 4 SAMPLES | COMMENTS |
| | INITIAL | ION-MILLED TO | | | | |
| NiFe | 330 | — | 300 | 2.31 | 2.26–2.34 | MILLED SAMPLES HAVE HIGHER ΔR/R BY ~0.41% ON AVERAGE |
| NiFe | 310 | — | 320 | 2.18 | 2.13–2.21 | |
| NiFe | 980 | 320 | 300 | 2.66 | 2.65–2.67 | |
| NiFe | 330 | — | 385 | 2.68 | 2.51–2.86 | MILLED SAMPLES HAVE HIGHER ΔR/R BY ~0.60% ON AVERAGE |
| NiFe | 970 | 320 | 385 | 3.30 | 3.23–3.40 | |
| NiFe | 1800 | 320 | 385 | 3.25 | 3.19–3.30 | |
| NiFeCo | ~320 | — | 200 | 1.99 | 1.96–2.01 | LOW TEMP. LOW ΔR/R |
| NiFeCo | ~320 | — | 385 | 2.63 | 2.59–2.68 | MILLED SAMPLES HAVE HIGHER ΔR/R BY ~0.34% ON AVERAGE |
| NiFeCo | ~1000 | ~320 | 385 | 2.93 | 2.86–2.99 | |
| NiFeCo | ~1000 | ~320 | 385 | 3.01 | 2.95–3.08 | |

METHOD OF IMPROVING MAGNETORESISTIVE EFFECT IN THIN MAGNETIC FILM

The invention described herein was made in the course of, or under, a contract with the Department of the Navy.

BACKGROUND OF THE INVENTION

1. Field of the Invention

The present invention relates to the field of magnetic memory systems for the storage of binary digital data and in particular to magnetic memory systems that store binary digital data as the presence or absence of cross-tie, Bloch-line pairs in the cross-tie wall of a thin magnetizable film.

2. Description of the Prior Art

The propagation of inverted Néel wall sections in a serial access memory system was proposed by L. J. Schwee in the publication "Proposal On Cross-tie Wall and Bloch-line Propagation In Thin Magnetic Films" IEEE Transactions on Magnetics, MAG 8, No. 3, pages 405–407, September 1972. Such a memory system utilizes a thin ferromagnetic film of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section, which is formed by a cross-tie on one side and a Bloch-line on the other, that is representative of a stored binary 1 or of a non-inverted Néel wall section (i.e., the absence of a cross-tie and Bloch-line pair) that is representative of a stored binary 0. Such information is moved or propagated along the cross-tie wall by the successive generation (and then the selective annihilation) of inverted Néel wall sections at successive memory cells along the cross-tie wall.

In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-tie Memory Simplified by the Use of Serrated Strips," L. J. Schwee, et al, AIP Conference Proceedings, No. 29, 21st Annual Conference on Magnetism and Magnetic Materials, 1975, published April 1976, pages 624–625, and in the publication "Cross-Tie/Bloch-Line Detection," G. J. Cosimini, et al, AIP Conference Proceedings, No. 3, 23rd Annual Conference on Magnetism and Magnetic Materials, 1977, published March 1978, pages 1828–1830, there have been published more results of the further development of cross-tie wall memory systems.

In prior art cross-tie wall memory systems, the magnetic film that functions as the storage medium has the property of uniaxial anisotropy provided by its magnetic field induced easy axis, which easy axis is generated in the magnetic film during its formation in the vapor deposition process. This easy axis provides an anisotropy that constrains the generation of the cross-tie wall along and parallel to the easy axis. In the above L. J. Schwee, et al, AIP publication there are proposed serrated strips of Permalloy film, about 350 Angstroms (Å) in thickness and 10 microns ($\mu$m) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a Néel or cross-tie wall that is formed along the centerline of the strip. Cross-ties are energetically more stable in the potential wells at the serration necks.

In the M. C. Paul, et al, U.S. Pat. No. 4,130,888 there is disclosed a cross-tie wall memory system and in particular a data track therefore that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie is constrained to follow the path defined by the magnetic film strip which path may be configured into a major loop, or circular data track, configuration for large capacity memory storage.

In the M. C. Paul, et al, U.S. Pat. No. 4,153,160 there is provided a nondestructive readout, random access cross-tie wall memory system in which there is provided a shift register having a cross-tie, Bloch-line pair generator at one end and a detector in the middle. The shift register consists of at least 2N memory cells spaced therealong, each memory cell consisting of a store section and a transfer section. The N cross-tie, Bloch-line pairs, or bits of the to-be-stored N-bit data word, are written or stored into the N memory cells of the shift register between the generator and the detector. For the readout of the stored data word, the N-bits are shifted through the detector into N memory cells (0 through N−1) with the N−$1^{th}$ bit being left resident in the detector. After readout, the N bits of the readout data word are restored into their original stored memory cells by being reverse shifted through the detector.

However, it has been found that because of the operating characteristics, including the inclusion of defects in the data track or shift register defining strips of thin ferromagnetic material, of the prior art cross-tie wall memory systems, it has been difficult to develop a workable memory system having a capacity of a large number of data bits, e.g., 1K. The primary problem has been with the method of propagation of the data bits, it requiring the successive generation and annihilation of the data bit defining cross-tie, Bloch-line pairs. System tolerances have been found to vary to the degree that random destruction of data bits has made large scale memories unreliable. In the L. G. Zierhut, et al, Patent Application having a filing date of June 1, 83 and a Ser. No. 383,434, this primary source of the loss of data bits has been obviated by a static memory system in which the data bits are selectively written into discrete memory elements, one at each intersection of an XY array. The memory elements are arranged in a typical two-dimensional, one-bit word memory array.

In the Zierhut, et al, invention, the thin magnetizable film storage material is formed in a plurality, XY, of discrete memory elements that are arranged in an X row, Y column matrix array. The X memory elements of each of the Y memory columns are intercoupled by low resistance current coupling elements whereby a current signal may be coupled to and caused to flow through the successive memory-column-forming coupling elements—memory elements—coupling elements. Superposed intersecting X row current conducting drive lines are inductively coupled to the discrete memory elements at each XY intersection. Readout of the storage, vel non, of a cross-tie, Bloch-line pair defining 1 data bit, or 0 data bit, at the selected memory element is accomplished by coupling a current signal to a selected one of the Y memory columns and a selected one of the X row lines and detecting a resistance change in the selected memory column. The configuration is of a 1-bit random access memory plane with nondestructive readout.

Readout of the information stored in each of the discrete memory elements is detected as the difference in the resistance to a flow of current through the thin magnetizable film that forms each of the memory elements when either a 1 data bit defining cross-tie, Bloch-line pair is or is not (a 0 data bit) stored therein. This change, $\Delta R$, in the resistance due to the storage of the cross-tie, Bloch-line pair in the memory element as a percentage of the resistance, R, when no cross-tie, Bloch-line pair is stored in the memory element is an accurate representation of the efficiency of the thin magnetizable film as a memory element. The present invention is directed toward a magnetizable memory element having an improved magnetoresistive effect, and, accordingly, improved readout characteristics.

SUMMARY OF THE INVENTION

In the present invention the magnetizable memory elements are formed of a ferromagnetic material that is vapor deposited, or deposited by any other suitable method such as sputtering, upon a suitable substrate to a thickness substantially greater than 320 Å, e.g., 1000 Å. This forms a continuous thin ferromagnetic film having a surface granularity in which minimum thickness is well above 320 Å. Next, while rotating, the thin ferromagnetic film is ion-milled, at a high angle of incidence, e.g., 60°, to a substantially uniform thickness of approximately 320 Å, having a modified granular structure. This structural modification of the thin ferromagnetic film provides a magnetic memory element of an improved $\Delta R/R$ characteristic.

BRIEF DESCRIPTION OF THE DRAWINGS

FIG. 1, comprised of FIGS. 1(a) through 1(e), is an illustration of the step-by-step process of the present invention.

FIG. 2 is an illustration of the thin magnetic film deposition evacuatable chamber used to implement the present invention.

FIG. 3 is an illustration of the ion-milling evacuatable chamber used to implement the present invention.

FIG. 4 is a tabular illustration of the improved effect of the present invention.

BACKGROUND

The sensing technique used for the cross-tie wall random access memory of Zierhut, et al relies on an anisotropic resistance characteristic brought about by a change in magnetization of the magnetic film memory element when a "1" or "0" state exists and when a sensing current is passed through the memory element. The maximum resistance change in a magentic film occurs when the magnetization direction changes between being parallel to the current direction and perpendicular to the current direction. This ideal condition does not exist completely when sensing data in the cross-tie wall memory. However, the application of a bias field, during sensing, can enhance the effect by making a larger portion of the two magnetization states more nearly parallel and perpendicular to the sensing current direction. Manipulations of this type, and special geometric designs involving memory element and/or contact shape and placement, help to increase the output signal, but the basic limitation is set by the magnetoresistive characteristic of the memory element itself.

The magnetoresistive characteristic is expressed as a percentage, based on the resistivity difference between the orthogonal magnetization states $(\rho_{MAX.}-\rho_{MIN.})$, divided by the maximum resistivity $\rho_{MAX.}$ (for the case where the sensing current is parallel to the magnetization direction). This is commonly expressed as $\Delta\rho/\rho$ but, by definition, a constant dimensional factor relates resistance R to resistivity $\rho$, so one may consider either $\Delta R/R$ or $\Delta\rho/\rho$. The percentages are the same in either case.

FACTORS INFLUENCING MAGNETORESISTANCE

Composition, thickness, and structure are film properties that affect the magnetoresistive percent value, and for present typical cross-tie wall NiFe films, 320 Å thick, vapor-deposited at a substrate temperature of 300° C., and having near-zero magnetostriction composition, this value has generally been between 2 and 2.5%. In an attempt to achieve higher magnetoresistive values, and therefore higher signal outputs, while still retaining the desired cross-tie wall characteristics and near-zero magnetostriction, composition effects have been evaluated in the form of NiFe and NiFeCo alloys, and structure effects have been induced by varied post-deposition temperature treatments and by a novel etch technique. The pesent invention relates to the structure effect achieved by a novel etch technique.

The $\Delta\rho$ of NiFe films does not vary appreciably as a function of thickness between 100 Å and 2500 Å, whereas the $\rho$ value decreases with increasing thickness. See E. N. Mitchell, "Compositional and Thickness Dependence of the Ferromagnetic Anisotropy in Resistance of Iron Nickel Films", J. Appl. Phys., Vol. 35, pp. 2604–2608, (1964). For application in a cross-tie wall device, the thickness of the film is essentially restricted to the range of approximately 250 Å to 400 Å so as to be energetically favorable for bistable existence or absence of cross-ties on a Néel wall. Fortunately, this is also a good thickness range for utilization of the anisotropic magnetoresistance effect in NiFe and NiFeCo, so the magnetic film memory element can serve as its own sensor. The thickness for maximum $\Delta\rho/\rho$ in nonmagnetorestrictive compositions of these alloys has been reported to be approximately 350 Å. See I. L. Sanders, "NiFeCo—An Alternative to Permalloy for Bubble Domain Detection?", IEEE Trans. on Magn., Vol. Mag. 19, No. 2, pp. 104–110, March, 1983.

STRUCTURE

In the initial stages of metal film growth, tiny separated islands appear and gradually grow in size and decrease in number as they begin to come into contact with each other. This process is typically associated with a rapid decrease in resistance. A continuous film is eventually formed which consists of a granular structure which apparently propagates upward from the substrate as the thickness grows. See Structure and Properties of Thin Films, J. Wiley pp 11-45, 1959.

The size of the grain structure and nature of the grain boundaries are related to the resistivity value of thin films and have been discussed in varying degree in many papers on magnetoresistive materials and film growth. See T. R. McGuire, et al, "Anisotropic Magnetroesistance in Ferromagnetic 3d Alloys", IEEE Trans. on Magn. Vol. Mag-11, No. 4, pp. 1018-1038, July, 1975; A. F. Mayadas, et al, Resistivity of Permalloy Films", J. Appl. Phys., Vol. 45, No. 6, pp. 2780–2781, June 1974; G. C. Chi, et al, "The Magnetorestivity, Structure, and Magnetic Anisotropy of RF Sputtered and E-Beam Evaporated NiFe Films", J. Appl. Phys., Vol. 52, No. 3, pp. 2439-2441, March, 1981; C. A. Neugebauer, "Electrical Resistivity of Ultrathin Metal Films", American Vacuum Society Transactions, Ninth Vacuum Symposium, Editor, G. H. Bancroft, The Macmillan Co., New York Collier-Macmillan Ltd., London, p.p. 45-51, 1962.

Deposition temperatures apparently affect the diffusion and growth process. Higher deposition temperatures give a higher degree of ordering and result in larger grain size and lower resistivity. Post-deposition anneal at 385° to 400° C. can also produce this effect, again resulting in lower resistivity and therefore larger $\Delta\rho/\rho$.

FILM STRUCTURE MODIFICATION

A special structural enhancement technique has been utilized to lower the film resistivity and thereby increase the magnetoresitance $\Delta\rho/\rho$ ratio without subjecting the films to high deposition or annealing temperatures. This technique avoids or helps to minimize possible undesirable thermal effects on photoresist and on grain growth in other associated film layers such as aluminum conductors. Also, it may provide a magnetic film having fewer vacancy sources, so vacancy migration through grain boundaries may be reduced, thereby reducing electromigration degradation. Effects of a passivation layer on NiFe electromigration have been proposed based on a similar argument by A. Gangulee, et al, "Long Term Stability of Magnetoresistive Bubble Detectors", IEEE Trans on Magn., MAG-10, pp. 848-851, 1974.

A pictorial representation of the stages of film growth and the manner of structural modification are shown in FIG. 1. It is believed that a normal cross-tie wall film, due to its ultra-thin nature, has a high and low profile corresponding to grains and intergranular zones or grain boundaries. These boundary regions offer greater resistance to the flow of current and therefore contribute to higher resistivity. Elevated deposition temperatures or post-deposition annealing contribute to higher mobility of atoms on the substrate surface (lower activation energy) and increased diffusion between nucleation islands or across grain boundaries. This results in larger grains and lower resistivity. Since the $\Delta\rho$ value remains essentially constant, the $\Delta\rho/\rho$ value therefore increases.

In the new, lower temperature technique of the present invention, the deposition melt composition is still adjusted such that the initial 320 Å or so of film buildup has near-zero magnetostriction. However, the deposition continues until the film thickness is built up to a higher level (in this case, 1000 Å or more). See I. Brodie, et al, "The Phyics of Microfabrication," Plenum Press, New York, NY, pp 37-38, 1982. This allows the grain structure to mature to a larger size and raises the low regions between grains, as the grains grow together and the boundary heights rise along with them, above the 320 Å level. Then, the film is ion-milled back down to the cross-tie film thickness (in this instance, 320 Å). However, because the thicker film retains its bumpy surface texture, the milling is done at a high grazing angle of incidence ($\sim 60°$ from normal) while the substrate rotates, so as to remove the high places preferentially and not reestablish the low boundary regions between grains. The resulting film then has a relatively uniform planarized cross-section and lower resistivity than a regular cross-tie wall film, without having had to deposit at a higher substrate temperature or having to subject the film to a higher temperature annealing treatment.

In the method of the present invention, see FIG. 2, a suitable substrate 10 is installed within an evacuatable enclosure 12 and the pressure is reduced to the desired level of, e.g., $10^{-6}$ mm Hg. The magnetic material, in a vapor state 14 from source 16, is directed upon and is deposited upon the heated surface, heated to a temperature of, e.g., 300° C. by heater 18, of the substrate 10. The film 20 is initially formed as a precontinuous thin film consisting of separated grains, FIG. 1(a), which continue growing, FIG. 1(b), until, FIG. 1(c), the grain boundaries have merged and have grown to form a continuous thin film, the grain boundary height of which, e.g., 1000 Å is substantially greater than the eventual ion milled thickness, e.g. 320 Å.

The substrate 10, with its continuous thin film 20, is then transferred to an ion milling (etching) chamber 30, see FIG. 3, which is then evacuated to the desired pressure, e.g., $10^{-6}$ mm Hg, and argon gas is introduced in chamber 31 up to a pressure of, e.g., $2\times10^{-4}$ mm Hg such that an ion beam 32 can be extracted from a plasma, collimated, neutralized with electrons and directed toward the substrate 10. The substrate 10, which resides on a water-cooled stage 33, is rotated about an axis 34 normal to its surface and is tilted so that the axis 34 is inclined approximately 60° from the direction of the bombarding ion beam 32, FIG. 1(d). The ion bombardment continues until, FIG. 1(e), the continuous thin film 20 has been ion milled to a substantially uniform film thickness of e.g. 320 Å.

RESULTS

Data collected thus far show significant results for a limited deposition temperature range and for the new film processing technique. FIG. 4 summarizes this data for NiFe and NiFeCo film compositions of 82.8-17.2% and 76-13-20% respectively.

MAGNETORESISTANCE VALUES

Within each group of film compositions, the $\Delta R/R$ magnetoresistance values were typically higher for the higher deposition temperatures as expected. The 320° NiFe film deposition was an exception to this, but the film was only 310 Å thick which would account for a higher $\rho$ and therefore lower $\Delta R/R$ than expected. All of the films that were deposited thick, followed by ion-milling down to the normal cross-tie wall film thickness, showed significant increases in $\Delta R/R$ values. For these NiFe films deposited in the 300° C.-320° C. range, $\Delta R/R$ was higher by 0.41%. In the 385° C. deposition temperature group, $\Delta R/R$ was higher by 0.60% for the milled films. For NiFeCo films in the 385° C. deposition temperature range, ΔR/R was higher by approximately 0.34% for the milled films.

Assuming that the thicknesses of the two composition groups (NiFe and NiFeCo) are consistent with each other, the ΔR/R Values are fairly similar. The NiFe films deposited at 385° C. showed the largest ΔR/R values and the lagest increase when ion-milling was used. The 3.30% ΔR/R value represents a potential 32 to 65% magnetoresistive sensing signal increase over the old 2 to 2.5% values for films deposited at 300° C. and not ion-milled. The increased deposition temperature and the ion-milling technique both contribute to the ΔR/R increase.

ANNEALING EFFECTS

Most of the films in these studies were annealed in a vacuum system at 400° C. for 30 minutes in a 100 oe. orienting field. As expected, several of these did acquire higher ΔR/R values as described in the literature. However, results were inconsistent, as several of the ΔR/R values of films deposited at 385° C., followed by ion-milling, actually decreased upon annealing. The highest value for the annealed films was 3.25%, comparable to the ion-milled film maximum of 3.30% without annealing.

SUMMARY

Use of the film structure modification technique of the present invention is not limited only to enhancement of the anisotropic magnetoresistive characteristic of thin magnetic films. Structure of ordinary conductor and insulator films can also be modified in the thickness region of initial growth, where tiny separated islands have nucleated and grown in size and come in contact with each other such that grain boundary heights are relatively small compared to the average height of the grains themselves. This general thickness region of interest varies with different film materials, substrates, substrate temperature and general deposition conditions. Films that form in this way, however, can have their relative grain boundary height-to-grain height ratio altered by deposition beyond the intended thickness, followed by ion-milling at an oblique angle down to the intended thickness, while rotating the substrate and film. This technique can be used to change the resistivity, intergranular diffusion, electromigration, optical transmission/scattering and possibly other fundamental characteristics of very thin films. The technique can also be applied to thicker films where grain boundaries are nearly as high as the grains themselves, to achieve a smoothing or leveling effect which may be desirable for compatibility with subsequent film layers or for modifying surface optical transmission and/or scattering characteristics.

What is claimed is:

1. In a thin film magnetic film the method of improving its magnetoresistive effect, comprising:
    forming a thin magnetic film upon a suitable substrate, initially said film consisting of separated grains, at a temperature that is in the range of approximately 300° C. to 320° C.;
    increasing the thickness of said thin magnetic film until the thin magnetic film becomes continuous, with the boundary height between grains substantially greater than a pre-determined thin magnetic film thickness;
    rotating said substrate about an axis that is perpendicular to the plane of said substrate;
    directing an ion beam upon said thin magnetic film at an angle with respect to the normal to the plane of said substrate; and
    ion-milling said thin magnetic film to said predetermined thin magnetic film thickness in a manner that modifies the usual grain structure for a film of that thickness.

2. The method of claim 1 in which said boundary height is approximately 1000 Å.

3. The method of claim 1 in which said ion-milling is performed with the direction of ion bombardment being directed approximately 60° to the normal to the plane of said substrate.

4. The method of claim 1 in which said predetermined thin magnetic film thickness is approximately 320 Å.

5. In a thin magnetic film the method of improving the magnetoresistive effect, comprising:
    depositing a magnetic film upon a suitable substrate as a series of separated grains at a temperature in the range of approximately 300° C. to 320° C.;
    continuing the deposition of said magnetic film until said magnetic film becomes continuous with the boundary height between grains being substantially greater than a predetermined thin magnetic film thickness;
    rotating said substrate about an axis that is normal to its surface; and
    directing an ion beam upon the surface of said magnetic film at an angle that is inclined with respect to said axis for ion milling said magnetic film to said predetermined thin magnetic film thickness.

6. The method of claim 5 in which said predetermined thin magnetic film thickness is in the range of 250 Å to 400 Å.

7. The method of claim 5 in which said ion milling is performed with the direction of ion bombardment being directed at a low angle of incidence with respect to the surface of said magnetic film.

8. The method of claim 5 in which said deposition temperature is approximately 300° C.;
    said grain boundary height is approximately 980 Å; and
    said predetermined thin magnetic film thickness is approximately 320 Å.

* * * * *